United States Patent
Rasheed et al.

(10) Patent No.: US 8,968,537 B2
(45) Date of Patent: Mar. 3, 2015

(54) PVD SPUTTERING TARGET WITH A PROTECTED BACKING PLATE

(75) Inventors: Muhammad M. Rasheed, San Jose, CA (US); Rongjun Wang, Dublin, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

(21) Appl. No.: 13/024,198

(22) Filed: Feb. 9, 2011

(65) Prior Publication Data

US 2012/0199469 A1  Aug. 9, 2012

(51) Int. Cl.
*H01J 37/34*       (2006.01)
*C23C 14/34*       (2006.01)
*C22C 19/03*       (2006.01)
*C22C 9/00*        (2006.01)
*C22C 9/04*        (2006.01)

(52) U.S. Cl.
CPC ......... *C23C 14/3407* (2013.01); *H01J 37/3426* (2013.01); *H01J 37/3435* (2013.01); *C22C 19/03* (2013.01); *C23C 14/3414* (2013.01); *C22C 9/00* (2013.01); *C22C 9/04* (2013.01)
USPC ............ 204/298.12; 204/192.13; 204/192.12; 204/192.34; 204/298.13; 204/298.11; 257/479; 136/256

(58) Field of Classification Search
CPC ......................... H01J 37/3435; H01J 37/3426
USPC ................ 257/479; 136/256; 204/298.11
See application file for complete search history.

(56) References Cited

U.S. PATENT DOCUMENTS 3,855,612 A * 12/1974 Rosvold ........................ 257/479
5,282,943 A    2/1994 Lannutti et al.
6,045,670 A *  4/2000 Adams et al. ............ 204/298.11
6,822,158 B2* 11/2004 Ouchida et al. ................ 136/256
7,611,610 B2* 11/2009 Nadeau et al. ........... 204/192.34
7,833,387 B2  11/2010 Mitsui et al.
2002/0162741 A1 11/2002 Gogh
2003/0129044 A1  7/2003 Kunze et al.
2003/0183506 A1* 10/2003 Ivanov et al. ............ 204/192.13
2005/0178653 A1*  8/2005 Fisher ...................... 204/192.12
2006/0006058 A1  1/2006 Tepman
2006/0024451 A1  2/2006 Mungkekar et al.

(Continued)

OTHER PUBLICATIONS

International Search Report and Written Opinion of the International Searching Authority mailed Sep. 3, 2012 in PCT/US2012/023474.

*Primary Examiner* — Keith Hendricks
*Assistant Examiner* — Timon Wanga
(74) *Attorney, Agent, or Firm* — Patterson & Sheridan, LLP (57) ABSTRACT

Embodiments of the invention provide sputtering targets utilized in physical vapor deposition (PVD) and methods to form such sputtering targets. In one embodiment, a sputtering target contains a target layer disposed on a backing plate, and a protective coating layer—usually containing a nickel material—covering and protecting a region of the backing plate that would otherwise be exposed to plasma during the PVD processes. In many examples, the target layer contains a nickel-platinum alloy, the backing plate contains a copper alloy (e.g., copper-zinc), and the protective coating layer contains metallic nickel. The protective coating layer eliminates the formation of highly conductive, copper contaminants typically derived by plasma erosion of the copper alloy contained within the exposed surfaces of the backing plate. Therefore, the substrates and the interior surfaces of the PVD chamber remain free of such copper contaminants during the PVD processes.

20 Claims, 5 Drawing Sheets

(56) References Cited

U.S. PATENT DOCUMENTS

| | | |
|---|---|---|
| 2006/0070876 A1 | 4/2006 | Wu et al. |
| 2006/0266638 A1 | 11/2006 | Hosokawa et al. |
| 2006/0266639 A1 | 11/2006 | Le et al. |
| 2006/0266643 A1 | 11/2006 | Le et al. |
| 2006/0289305 A1 | 12/2006 | White |
| 2007/0017798 A1 | 1/2007 | Inagawa |
| 2007/0034153 A1 | 2/2007 | Lu et al. |
| 2007/0039818 A1* | 2/2007 | Hasegawa ............... 204/298.12 |
| 2007/0056845 A1 | 3/2007 | Ye et al. |
| 2007/0062449 A1 | 3/2007 | Mungekar et al. |
| 2007/0125646 A1 | 6/2007 | Young et al. |
| 2007/0170052 A1* | 7/2007 | Ritchie et al. ............ 204/298.12 |
| 2007/0205101 A1 | 9/2007 | Ye et al. |
| 2008/0000770 A1 | 1/2008 | White |
| 2008/0185284 A1 | 8/2008 | Chen et al. |
| 2008/0188087 A1 | 8/2008 | Chen et al. |
| 2008/0188090 A1 | 8/2008 | Chen et al. |
| 2008/0293336 A1 | 11/2008 | Zhang et al. |
| 2008/0308416 A1 | 12/2008 | Allen et al. |
| 2009/0025636 A1 | 1/2009 | Rasheed |
| 2009/0034147 A1 | 2/2009 | Narendrnath et al. |
| 2009/0034148 A1 | 2/2009 | Lubomirsky et al. |
| 2009/0034149 A1 | 2/2009 | Lubomirsky et al. |
| 2009/0068433 A1 | 3/2009 | Rasheed |
| 2009/0090620 A1* | 4/2009 | Pavloff .................... 204/298.13 |
| 2009/0197015 A1 | 8/2009 | Kudela et al. |
| 2009/0258162 A1 | 10/2009 | Furuta et al. |
| 2009/0266299 A1 | 10/2009 | Rasheed et al. |
| 2009/0277788 A1* | 11/2009 | Oda et al. ................. 204/298.13 |
| 2010/0048028 A1 | 2/2010 | Rasheed et al. |
| 2010/0108500 A1 | 5/2010 | Hawrylchak et al. |
| 2010/0136216 A1 | 6/2010 | Tsuei et al. |
| 2010/0252416 A1 | 10/2010 | Liu et al. |
| 2010/0252417 A1 | 10/2010 | Allen et al. |
| 2010/0288631 A1 | 11/2010 | Wu et al. |
| 2011/0036709 A1 | 2/2011 | Hawrylchak et al. |

\* cited by examiner

PVD SPUTTERING TARGET WITH A PROTECTED BACKING PLATE

BACKGROUND OF THE INVENTION

1. Field of the Invention

Embodiments of the invention generally relate to devices and methods used in vapor deposition, and more specifically relate to sputtering targets used in physical vapor deposition (PVD) and methods for forming the same.

2. Description of the Related Art

Nickel-based materials, including metallic nickel and nickel-platinum alloys, are often used in the manufacturing of electronic and semiconductor devices. Nickel-platinum alloys have gained popularity for use in silicide applications. Often, the nickel-platinum alloys, as well as other materials, are deposited from a sputtering target or PVD target during a radio-frequency (RF) PVD process. The sputtering target usually contains a nickel target adhered to a backing plate. The nickel target is typically of a high purity metal, such as 99.9% or greater, and may contain metallic nickel or a nickel alloy. The backing plate is usually composed of a highly conductive metal, such as a copper material.

The sputtering target is exposed to a plasma while being sputtered during a PVD process. Besides sputtering the metallic target material (e.g., nickel) during the process, other metallic material derived from exposed surfaces within the PVD chamber may also be removed or eroded during the PVD process. Such metallic material causes particulate contamination in the PVD chamber and therefore severely compromises the deposited materials on the substrate. Ceramic liners or shields are often used to cover and protect stainless steel and/or aluminum surfaces of the PVD chamber from the plasma. However, other metallic surfaces, such as exposed regions on target backing plates, are usually not protected by ceramic liners and shields and therefore are directly exposed to the plasma. Since many backing plates are composed of a copper material, highly conductive particles and contaminants are often generated and disembark on to surfaces within the PVD chamber or directly on to the substrate. The conductive contaminants eventually compromise the substrate fabrication process.

Therefore, there is a need to provide a sputtering target free or substantially free of a contaminant source when exposed to plasma during a sputtering or PVD process.

SUMMARY OF THE INVENTION

Embodiments of the invention generally provide sputtering targets utilized in physical vapor deposition (PVD) and methods to form such sputtering targets. In one embodiment, a sputtering target contains a target layer disposed on a backing plate, and a protective coating layer covering and protecting a region of the backing plate that would otherwise be exposed to plasma during the PVD processes. In many examples, the target layer contains a nickel alloy (e.g., nickel-platinum alloy), the backing plate contains a copper alloy (e.g., copper-zinc alloy), and the protective coating layer contains a nickel material (e.g., metallic nickel). In other examples, the target layer contains tungsten or a tungsten alloy, the backing plate contains a copper alloy (e.g., copper-zinc alloy), and the protective coating layer contains a tungsten material (e.g., metallic tungsten). The backing plate has a front side opposed to a back side, wherein the front side contains the outer support surface encompassing an inner target surface, the back side contains an outer back surface encompassing an inner recessed surface. The target layer contains at least one metal and is disposed on the inner target surface of the backing plate, while the protective coating layer is disposed on at least a portion of the outer support surface, such as on a roughened region. The protective coating layer eliminates the formation of metallic contaminants, such as highly conductive, copper contaminants typically derived by plasma erosion of the copper alloy contained within the exposed surfaces of the backing plate. Therefore, the substrates and the interior surfaces of the PVD chamber remain free of such copper contaminants during the PVD processes.

The target layer generally contains a material, such as nickel, platinum, nickel-platinum alloy, tungsten, palladium, cobalt, alloys thereof, derivatives thereof, or combinations thereof. In many examples, the material of the target layer contains nickel or a nickel alloy, such as a nickel-platinum alloy, or may contain tungsten, a tungsten alloy, cobalt, or a cobalt alloy. The nickel-platinum alloy may contain a nickel concentration by weight within a range from about 80% to about 98%, such as from about 85% to about 95%, as well as a platinum concentration by weight within a range from about 2% to about 20%, such as from about 5% to about 15%. In several specific examples, the target layer contains nickel-platinum alloys such as NiPt5% (about 95 wt % of nickel and about 5 wt % of platinum), NiPt10% (about 90 wt % of nickel and about 10 wt % of platinum), or NiPt15% (about 85 wt % of nickel and about 15 wt % of platinum).

In another embodiment, a sputtering target is provided which includes a backing plate containing a copper alloy and having a front side opposed to a back side, wherein the front side contains an outer support surface encompassing an inner target surface and the back side contains an outer back surface encompassing an inner recessed surface, a target layer containing a nickel-platinum alloy disposed on the inner target surface of the backing plate, and a protective coating layer containing nickel disposed on at least a portion of the outer support surface, such as on the roughened region, wherein the protective coating layer has a thickness within a range from about 0.004 inches (0.10 mm) and 0.040 inches (1.02 mm), such as from about 0.008 inches (0.20 mm) and 0.016 inches (0.41 mm). In some examples, the copper alloy contained within the backing plate is a copper-zinc alloy, and the copper-zinc alloy further has a copper concentration by weight within a range from about 58% to about 62% and a zinc concentration by weight within a range from about 38% to about 42%.

In another embodiment, a method for forming a deposition target having a protective film over a target backing plate is provided which includes roughening at least a portion of an outer support surface of a sputtering target to form a roughened region having a mean surface roughness within a range from about 80 microinches (μin) to about 500 μin. The sputtering target contains a backing plate containing a copper alloy and having a front side opposed to a back side, the front side contains the outer support surface encompassing an inner target surface and the back side contains an outer back surface encompassing an inner recessed surface, and a target layer containing nickel, a nickel alloy, tungsten or a tungsten alloy disposed on the inner target surface of the backing plate. In one example, the method further provides depositing a protective coating layer containing nickel on the roughened region of the outer support surface. In another example, the method further provides depositing a protective coating layer containing tungsten on the roughened region of the outer support surface. The protective coating layer has a thickness within a range from about 0.002 inches to about 0.100 inches.

Prior to depositing the protective coating layer, a region or portion of the outer support surface of the backing plate may be roughened by abrasive blasting which includes bead blasting and/or sand blasting. The roughened region of the outer support surface of the backing plate is roughened in order to have a mean surface roughness within a range from about 80 μin to about 500 μin, such as from about 100 μin to about 400 μin, such as from about 120 μin to about 220 μin or from about 200 μin to about 300 μin. Subsequently, the protective coating layer may be deposited on or over the roughened region by a deposition process, such as a plasma spray technique. The exposed or upper surface of the protective coating layer may have a mean surface roughness within a range from about 100 μin to about 500 μin, such as from about 120 μin to about 400 μin, such as from about 150 μin to about 350 μin.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention provide sputtering targets utilized in physical vapor deposition (PVD) and methods to form such sputtering targets. In one embodiment, a sputtering target contains a target layer disposed on a backing plate, and a protective coating layer covering and protecting a region of the backing plate that would otherwise be exposed to plasma during the PVD processes. In many examples, the target layer contains a nickel-platinum alloy, the backing plate contains a copper alloy, and the protective coating layer contains a nickel material. In other examples, the target layer contains tungsten or a tungsten alloy, the backing plate contains a copper alloy, and the protective coating layer contains a tungsten material. The protective coating layer which is separate from the target layer eliminates the formation of highly conductive, copper contaminants typically derived by plasma erosion of the copper alloy contained within the exposed surfaces of the backing plate. Therefore, the substrates and the interior surfaces of the PVD chamber remain free of such copper contaminants during the PVD processes.

FIGS. 1A-1D illustrate schematic drawings of a sputtering target 100 according to embodiments described herein. In one embodiment, the sputtering target 100 contains a target layer 150 disposed on a backing plate 110, and a protective coating layer 160 disposed on at least a portion of the backing plate 110, such as covering a region 114 of an outer support surface 122 of the backing plate 110.

The target layer 150 contains at least one metal disposed on the inner target surface 124 of the backing plate 110. In some examples, the target layer 150 contains a metallic material, such as nickel, platinum, nickel-platinum alloy, tungsten, palladium, cobalt, alloys thereof, derivatives thereof, or combinations thereof. The target material contained within the target layer 150 usually has a high purity level, such as a purity level of about 99.99% (4N) or greater, such as about 99.995% (4N5) or greater, or about 99.999% (5N) or greater, or about 99.9995% (5N5) or greater. The purity level is indicative to the metallic target material concentration relative to the concentration of impurities, contaminants, or trace elements. For nickel-platinum alloys of the metallic target material, the purity level is indicative to the nickel-platinum concentration by weight relative to the concentration by weight of any impurities or trace elements. In one example, the target material contains a nickel-platinum alloy having a purity of at least 4N5 or greater. Similarly, for metallic tungsten target material, the purity level is indicative to the tungsten concentration by weight relative to the concentration by weight of any impurities or trace elements. In one example, the target material contains a metallic tungsten having a purity of at least 5N or greater.

In many examples, the material of the target layer 150 contains nickel or a nickel alloy, such as a nickel-platinum alloy. The nickel-platinum alloy may contain a nickel concentration by weight within a range from about 70% to about 99.9%, such as from about 80% to about 98%, or such as from about 85% to about 95%. The nickel-platinum alloy may also contain a platinum concentration by weight within a range from about 0.5% to about 40%, such as from about 2% to about 20%, or such as from about 5% to about 15%. In several specific examples, the target layer 150 contains nickel-platinum alloys such as NiPt5% (about 95 wt % of nickel and about 5 wt % of platinum), NiPt10% (about 90 wt % of nickel and about 10 wt % of platinum), or NiPt15% (about 85 wt % of nickel and about 15 wt % of platinum). In other examples, the target layer 150 contains metallic tungsten, a tungsten alloy, cobalt, or a cobalt alloy.

Figure 1A:
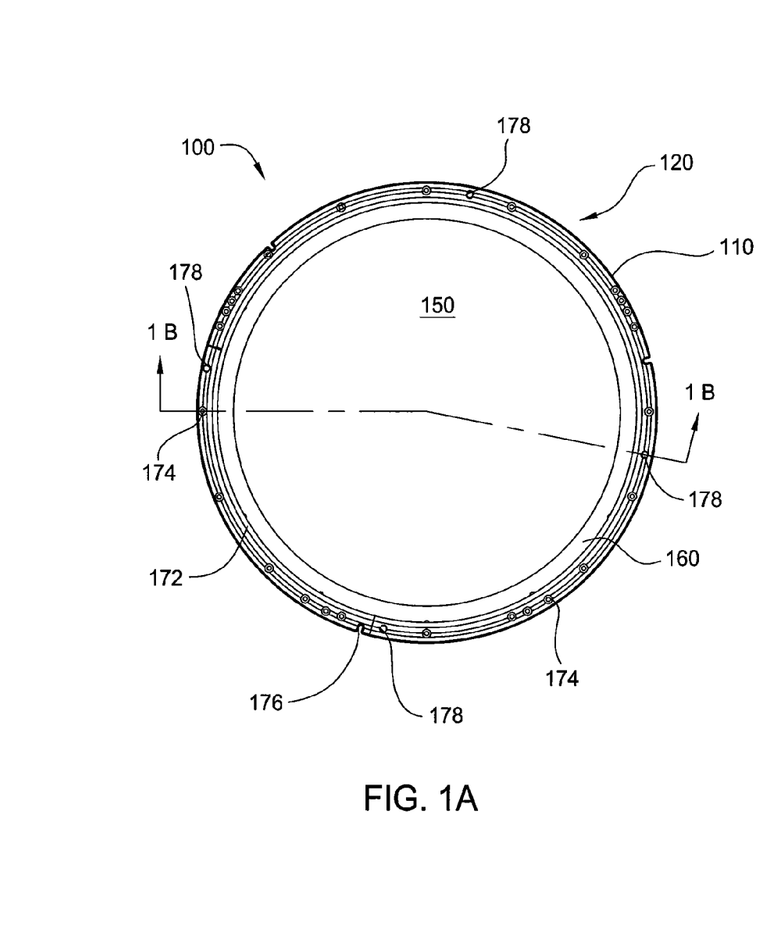
FIGS. 1A-1D depict a sputtering target, as described in embodiments herein.

The thickness of the target layer 150 is proportional to the life of the sputtering target 100, as well as to the optimization of uniformity and step coverage for the deposited films. FIGS. 1C-1D depict planes 128 and 152 extending across the inner target surface 124 of the backing plate 110 and the target surface 151 of the target layer 150, respectively. Planes 128 and 152 generally extend parallel to each other separated by a predetermined distance or thickness referred to as the target thickness 154. In one embodiment, the target layer 150 may have a thickness within a range from about 0.050 inches (1.3 mm) to about 0.400 inches (10.2 mm), such as from about 0.120 inches (3.0 mm) to about 0.150 inches (3.8 mm)—for example, about 0.138 inches (3.5 mm). In an alternative embodiment, the target layer 150 may have a thickness within a range from about 0.080 inches (2.0 mm) to about 0.600 inches (15.2 mm), such as from about 0.150 inches (3.8 mm) to about 0.350 inches (8.9 mm)—for example, about 0.250 inches (6.4 mm). The diameter of the target layer 150 is proportional to the size of the substrate to be exposed to the PVD process. For example, if a 300 mm diameter substrate was to be processed, the target layer 150 may have a diameter within a range from about 16 inches (406 mm) to about 19 inches (483 mm), such as from about 17 inches (432 mm) to about 18 inches (457 mm)—for example, about 17.5 inches (445 mm).

The target layer 150 may be diffusion bonded or otherwise affixed onto the backing plate 110 at an interface between the inner target surface 124 and the target layer 150. In another embodiment, the target layer 150 may be deposited on or over the inner target surface 124 of the backing plate 110. Alternatively, the backing plate 110 and the target layer 150 may be coupled or otherwise adhered together by an interlayer (not shown) disposed therebetween. The optionally interlayer may be used to increase the adhesion between the backing plate 110 and the target layer 150. The interlayer usually contains a metal, such aluminum, copper, nickel, derivatives thereof, or alloys thereof and may be in the form of a metallic insert, film, plate, or solder. In some examples, the interlayer contains a metallic insert disposed—such as diffusion bonded—between the inner target surface 124 and the target layer 150. The metallic insert may be contain aluminum or an aluminum alloy—in one example. In other examples, the interlayer contains a metallic solder such as an aluminum-containing solder, a nickel-containing solder, or a copper-containing solder.

The backing plate 110 typically is composed of or made from a conductive material, such as copper, copper alloys, zinc, copper-zinc alloys, steel, stainless steel, iron, nickel, chromium, copper-chromium alloys, aluminum, lead, silicon, alloys thereof, derivatives thereof, or combinations thereof. In many examples, the backing plate 110 contains copper or a copper alloy. The copper alloy may contain a copper concentration by weight within a range from about 50% to about 99.9%, such as from about 55% to about 95%. In some examples, the copper alloy may contain a copper concentration by weight within a range from about 50% to about 70%, such as about 60%, and in other examples, within a range from about 70% to about 90%, such as about 80%.

In some embodiments, the backing plate 110 contains a copper-zinc alloy. In some examples, the copper-zinc alloy may have a copper concentration by weight within a range from about 58% to about 62% and a zinc concentration by weight within a range from about 38% to about 42%. In a specific example, the copper-zinc alloy of the backing plate 110 contains about 60.8% copper and about 39.3% zinc, which is also known as Cu—Zn alloy C46400. In other examples, the copper-zinc alloy may have a copper concentration by weight within a range from about 75% to about 85% and a zinc concentration by weight within a range from about 15% to about 25%. In another specific example, the copper-zinc alloy of the backing plate 110 contains about 80% copper and about 20% zinc, which is also known as Cu—Zn alloy C24000.

In additional examples, the backing plate 110 may also contain a copper-chromium alloy that has a copper concentration by weight within a range from about 95% to about 99.5% and a chromium concentration by weight within a range from about 0.5% to about 5%. In a specific example, the copper-chromium alloy of the backing plate 110 contains about 99% copper and about 1% chromium.

The front side 120 of the backing plate 110 is opposite the back side 130, such that the front side 120 contains the outer support surface 122 encompassing an inner target surface 124, and the back side 130 contains an outer back surface 132 encompassing an inner recessed surface 134. The region 114 extends along the outer support surface 122 of the backing plate 110 and therefore also encompasses the inner target surface 124.

Figure 1B:
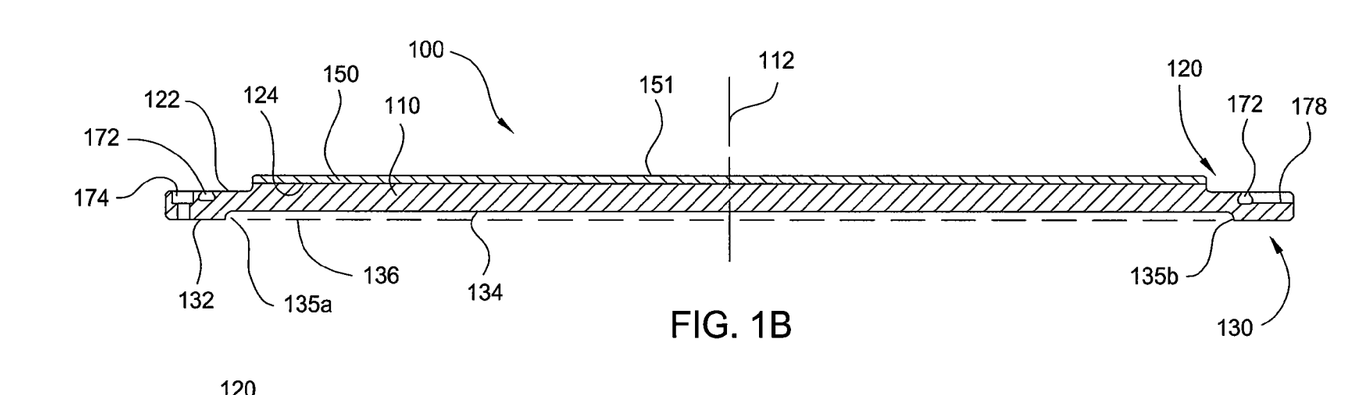
Figure 1C:
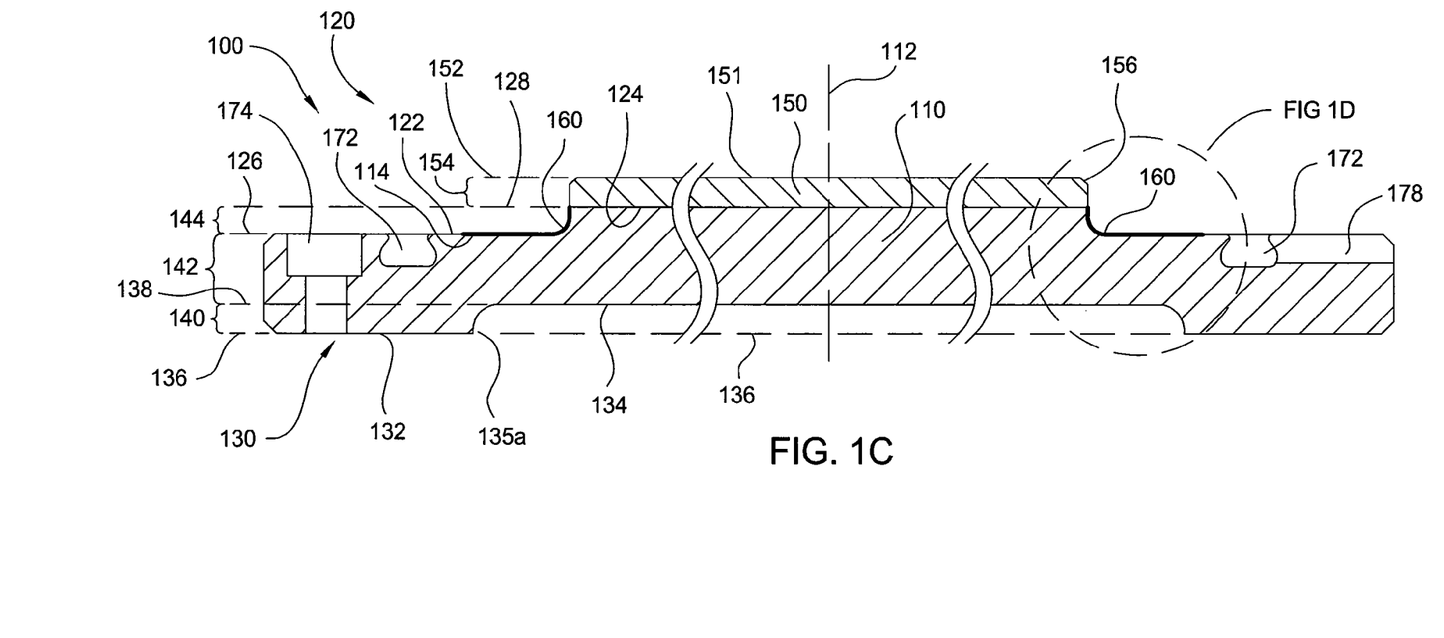
Figure 1D:
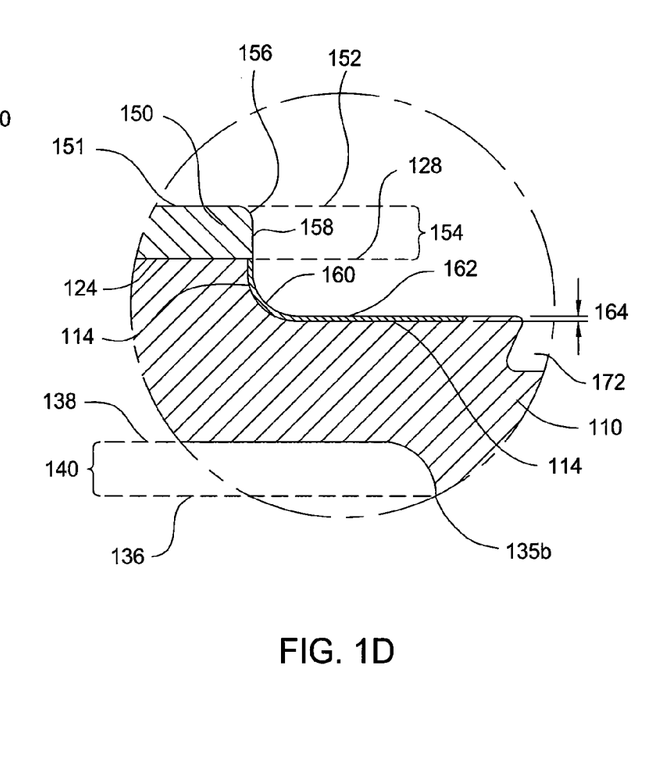

The sputtering target 100, the backing plate 110, and the target layer 150 share a common central axis, such as the central axis 112 depicted in FIGS. 1B-1C. The central axis 112 extends perpendicular or substantially perpendicular to a plane 152 extending across the target surface 151 of the target layer 150, a plane 126 extending across the outer support surface 122, a plane 128 extending across the inner target surface 124, a plane 136 extending across the outer back surface 132, and a plane 138 extending across the inner recessed surface 134.

FIGS. 1C-1D depict planes 136 and 138 extending across the outer back surface 132 and the inner recessed surface 134, respectively, of the backing plate 110. The planes 136 and 138 extend parallel or substantially parallel to each other separated by a predetermined distance referenced as the target recess depth 140. The target recess depth 140 is also equal to a predetermined distance or thickness of a portion of the body of the backing plate 110—which also extends between the planes 136 and 138. FIG. 1C also depicts the planes 126 and 128 extending across the outer support surface 122 and the inner target surface 124, respectively, of the backing plate 110. The planes 126 and 138 generally extend parallel or substantially parallel to each other separated by a predetermined distance or thickness of a portion of the body of the backing plate 110—which is referenced as the outer backing plate thickness 142. Similarly, planes 126 and 128 generally extend parallel or substantially parallel to each other separated by a predetermined distance or thickness of another portion of the body of the backing plate 110—which is referenced as the inner backing plate thickness 144.

Each sputtering target 100 may have a predetermined value for a target recess depth 140 within the backing plate 110 relative to specified process conditions or chamber configurations. The predetermined value for the target recess depth 140 may be selected in order to adjust the target/magnet spacing which is the distance between the target layer 150 of the sputtering target 100 and a magnetron, such as the magnetron unit 234 depicted in FIGS. 2 and 3A-3B. The target recess depth 140 is a predetermined distance that extends between planes 136 and 138 extending across, respectively, the outer back surface 132 and the inner recessed surface 134 of the backing plate 110. The target recess depth 140 may be measured along the portion of the central axis 112 of the backing plate 110 which extends between the planes 136 and 138. The target recess depth 140 may be within a range from about 0.05 inches (1.3 mm) to about 0.50 inches (12.7 mm), such as from about 0.10 inches (2.5 mm) to about 0.40 inches (10.2 mm), such as from about 0.10 inches (2.5 mm) to about 0.20 inches (5.1 mm)—for example, about 0.12 inches (3.0 mm) or about 0.15 inches (3.8 mm).

The target recess diameter and the diameter of the inner recessed surface 134 are determined, in part, to maximize the magnet rotation diameter for achieving high uniformity and step coverage during a PVD process. The length of the corresponding target recess diameter, measured between points 135a and 135b along the plane 136 as depicted in FIGS. 1B-1C, may be within a range from about 17.5 inches to about 19.5 inches, such as, from about 18 inches to about 19 inches, for example, about 18.5 inches. The diameter of the inner recessed surface 134 is measured along the plane 138, as depicted in FIG. 1C, and may be within a range from about 17.5 inches to about 19.5 inches, such as, from about 18 inches to about 19 inches, for example, about 18.5 inches. In many embodiments, the length of the target recess diameter is slightly longer than the length of the diameter of the inner recessed surface 134 since the sidewall between the outer back surface 132 and the inner recessed surface 134 generally taper inwardly towards the central axis 112. The tapered sidewall between the outer back surface 132 and the inner recessed surface 134 may taper at an arc having a radius within a range from about 0.05 inches (1.3 mm) to about 0.30 inches (7.6 mm), such as from about 0.10 inches (2.5 mm) to about 0.2 inches (5.1 mm)—for example, about 0.15 inches (3.8 mm). However, in an alternative embodiment, the target recess diameter and the diameter of the inner recessed surface 134 are the same length and the sidewall between the outer back surface 132 and the inner recessed surface 134 extends parallel to the central axis 112.

The overall thickness of the backing plate 110 may be within a range from about 0.30 inches (7.6 mm) to about 1 inch (25.4 mm), such as from about 0.50 inches (12.7 mm) to about 0.80 inches (20.3 mm)—for example, about 0.65 inches (16.5 mm). A first portion of the backing plate 110, such as the portion which extends between the planes 136 and 138, may be within a range from about 0.05 inches (1.3 mm) to about 0.50 inches (12.7 mm), such as from about 0.10 inches (2.5 mm) to about 0.40 inches (10.2 mm)—for example, about 0.15 inches (3.8 mm). The outer backing plate thickness 142 may be within a range from about 0.05 inches (1.3 mm) to about 0.70 inches (17.8 mm), such as from about 0.10 inches (2.5 mm) to about 0.50 inches (12.7 mm)—for example, about 0.33 inches (8.4 mm). The inner backing plate thickness 144 may be within a range from about 0.05 inches (1.3 mm) to about 0.50 inches (12.7 mm), such as from about 0.10 inches (2.5 mm) to about 0.40 inches (10.2 mm)—for example, about 0.17 inches (4.3 mm).

Prior to depositing the protective coating layer 160, the region 114 of the outer support surface 122 of the backing plate 110 may be roughened by abrasive blasting which includes bead blasting, sand blasting, soda blasting, powder blasting, as well as other particulate blasting techniques. Other techniques may be used to roughen the region 114 of the outer support surface 122 including mechanical techniques (e.g., wheel abrasion), chemical techniques (e.g., acid etch), plasma etch techniques, and laser etch techniques. The region 114 of the outer support surface 122 of the backing plate 110 is roughened in order to provide a strong adhesion interface between the outer support surface 122 and the protective coating layer 160. The region 114 of the outer support surface 122 may have a mean surface roughness within a range from about 80 microinches ($\mu$in) to about 500 $\mu$in, such as from about 100 $\mu$in to about 400 $\mu$in, such as from about 120 $\mu$in to about 220 $\mu$in or from about 200 $\mu$in to about 300 $\mu$in. In one example, the region 114 has a mean surface roughness within a range from about 80 $\mu$in to about 500 $\mu$in prior to depositing the protective coating layer 160 on the region 114 of the outer support surface 122.

The protective coating layer 160 is a protective film which may be deposited, plated, or otherwise formed on or over the target backing plate 110. In one embodiment, the protective coating layer 160 is deposited on or over the region 114 on the outer support surface 122 of the backing plate 110 by a deposition process, such as a plasma spray technique. The protective coating layer 160 contains a metal (e.g., metallic nickel, nickel alloy, metallic tungsten, or tungsten alloy) disposed on at least a portion of the outer support surface 122, such as on the region 114. The protective coating layer 160 inhibits the erosion of the backing plate 110 which otherwise would produce metallic contaminants from plasma and/or chemical exposed areas of region 114. In many examples, the backing plate 110 contains a copper-zinc alloy—therefore—the protective coating layer 160 inhibits the erosion of the backing plate 110 and therefore ceases the otherwise production of highly conductive, copper-containing contaminants.

In some examples, the protective coating layer 160 contains a plasma-sprayed metal, such as metallic nickel or metallic tungsten or a sputtered metal, such as a nickel material or a tungsten material. In one embodiment, the protective coating layer 160 contains a common metallic element as the target layer 150. For example, the target layer 150 contains nickel or a nickel alloy (e.g., nickel-platinum alloy) and the protective coating layer 160 contains metallic nickel. In another example, the target layer 150 contains tungsten or a tungsten alloy and the protective coating layer 160 contains metallic tungsten. In another example, the target layer 150 contains cobalt or a cobalt alloy and the protective coating layer 160 contains metallic cobalt. Various deposition techniques may be utilized to form or otherwise deposit the protective coating layer 160 onto the region 114 of the backing plate 110, such as a plasma spray process, a sputtering process, a PVD process, a CVD process, a PE-CVD process, an ALD process, a PE-ALD process, an electroplating or electrochemical plating process, an electroless deposition process, or derivatives thereof. The protective coating layer 160 usually contains a single layer of material, however, in an alternative embodiment, the protective coating layer 160 may contain multiple layers of the same material or different materials.

The thickness of the protective coating layer 160 is proportional to the expected target life. FIG. 1D depicts the protective coating layer 160 having a thickness 164. The thickness 164 of the protective coating layer 160 may be within a range from about 0.002 inches (0.05 mm) and 0.100 inches (2.54 mm), such as from about 0.004 inches (0.10 mm) and 0.040 inches (1.02 mm), such as from about 0.008 inches (0.20 mm) and 0.016 inches (0.41 mm). The exposed or upper surface 162 of the protective coating layer 160 may have a mean surface roughness (Ra) within a range from about 100 $\mu$in to about 500 $\mu$in, such as from about 120 $\mu$in to about 400 $\mu$in, or such as from about 150 $\mu$in to about 350 $\mu$in. In one example, the protective coating layer 160 contains metallic nickel, has a thickness within a range from about 0.008 inches (0.20 mm) and 0.016 inches (0.41 mm), and has a mean surface roughness of the upper surface within a range from about 150 $\mu$in to about 350 $\mu$in. In another example, the protective coating layer 160 contains metallic tungsten, has a thickness within a range from about 0.008 inches (0.20 mm) and 0.016 inches (0.41 mm), and has a mean surface roughness of the upper surface within a range from about 150 $\mu$in to about 350 $\mu$in.

Figure 2:
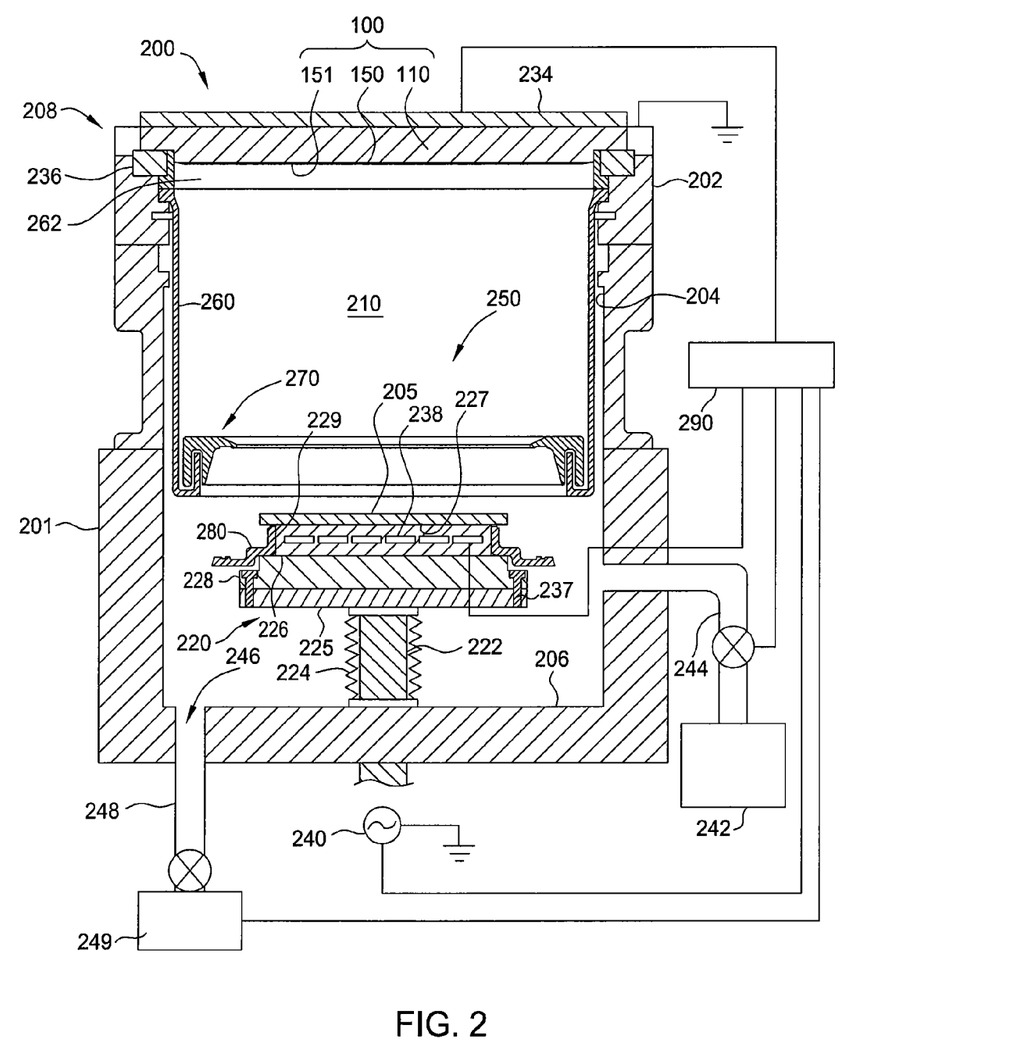
FIG. 2 is a simplified cross-sectional view of a PVD chamber containing the sputtering target of FIGS. 1A-1D, as described in another embodiment herein.
Figure 3A:
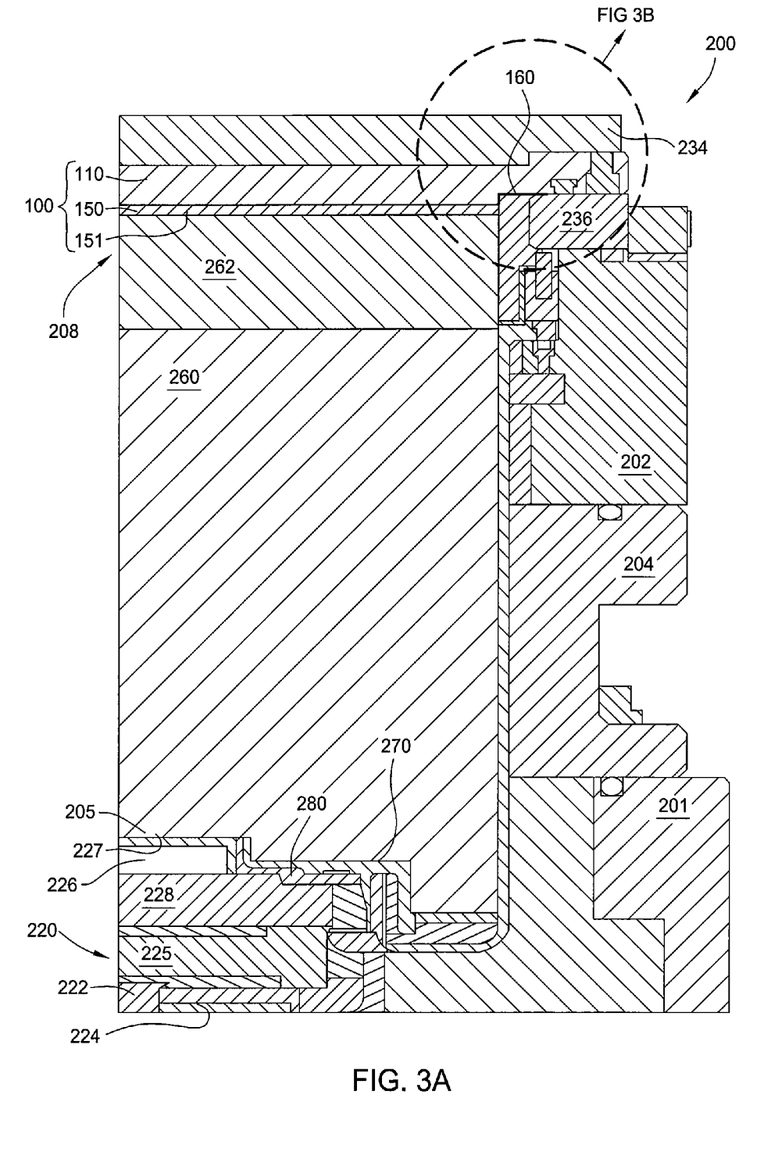
FIGS. 3A-3B depict a partial cross-sectional view of the PVD chamber of FIG. 2, as described in embodiments herein.
Figure 3B:
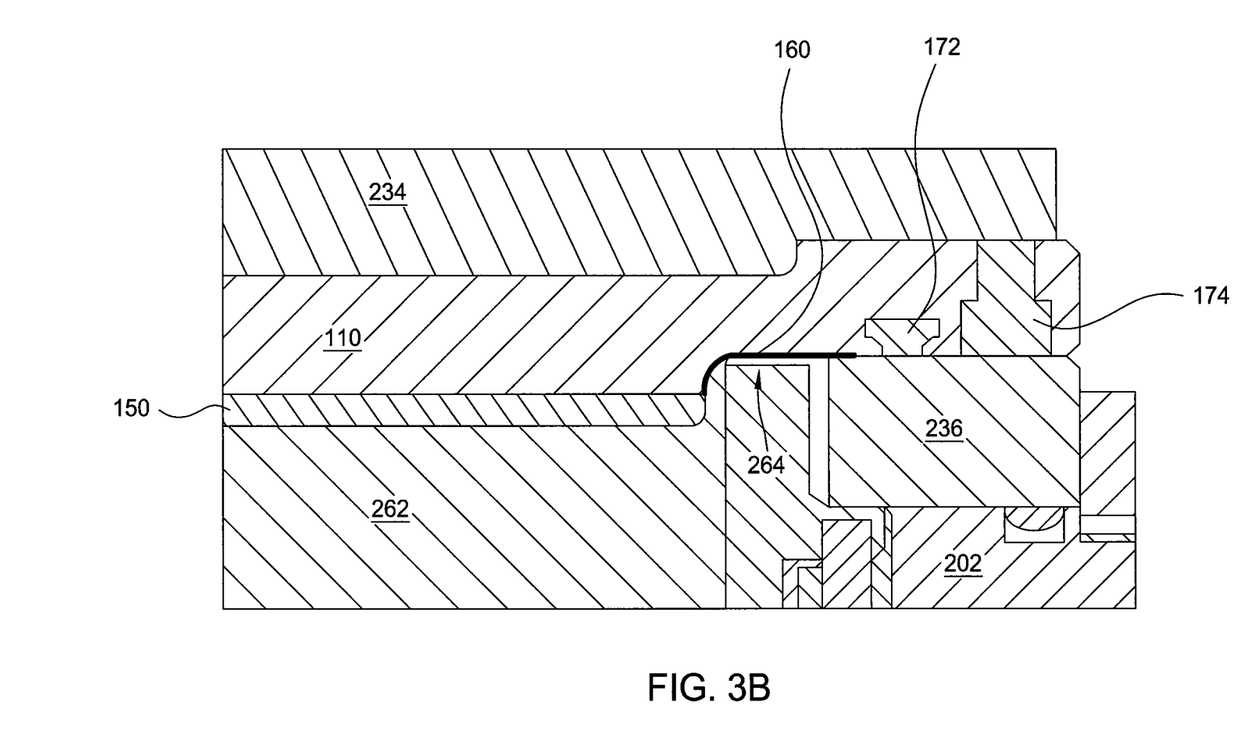

By depositing the protective coating layer 160 on top of the region 114 extending along the outer support surface 122 of the front side 120 of the backing plate 110, the protective coating layer 160 covers and protects the underlying region of the outer support surface 122 from reacting with chemicals and/or plasmas within processing chambers, such as a PVD chamber 200 depicted in FIGS. 2 and 3A-3B, therefore preventing the conductive material of the backing plate 110 from producing undesirable contaminants which otherwise would be formed and distributed throughout the processing chamber and onto the work-pieces, such as substrate 205. Although some embodiments disclosed herein describe the sputtering target 100 which has the protective coating layer 160 containing metallic nickel or nickel alloys and the target layer 150 containing nickel, nickel-platinum alloy, or other nickel alloys, the basic scope of embodiments is applicable to other metals or materials contained within the target layer 150 provided that the metals or materials contained within the protective coating layer 160 is chemically compatible with the target layer 150. In other embodiments described herein, the sputtering target 100 has the target layer 150 containing metallic tungsten or a tungsten alloy and the protective coating layer 160 containing metallic tungsten, a tungsten material, or a tungsten alloy.

FIGS. 1A-1D depict the sputtering target 100 with a circular geometry. The size of the sputtering target 100 may be adjusted according to the different sizes of substrates to be deposited to within the PVD chamber 200. In one embodiment, the diameter of the substrate to be processed may be within a range from about 200 mm to about 450 mm, for example, about 300 mm. In many examples, target material from the sputtering target 100 is sputtered onto a 300 mm substrate. The overall diameter length of the sputtering target 100 must properly fit within the processing chamber, such as the PVD chamber 200, and maintain the dark spacer gap at a predetermined width for preventing plasma arcing and reducing the sputtering of the protective coating layer 160 from the backing plate 110. The overall diameter length of the sputtering target 100 corresponds to the diameter length of the backing plate 110, measured along the plane 136, both may be within a range from about 18 inches to about 23 inches, such as, from about 20 inches to about 22 inches, for example, about 20.7 inches.

The corresponding lengths of the target recess diameter and the diameter of the inner recessed surface 134 may independently be within a range from about 17.5 inches to about 19.5 inches, such as, from about 18 inches to about 19 inches, for example, about 18.5 inches. The length of the corresponding target recess depth 140 may be within a range from about 0.05 inches (1.3 mm) to about 0.50 inches (12.7 mm), such as from about 0.10 inches (2.5 mm) to about 0.40 inches (10.2 mm)—for example, about 0.15 inches (3.8 mm). The diameter of the corresponding target layer 150 may be within a range from about 16.5 inches to about 18.5 inches, such as, from about 17 inches to about 18 inches, for example, about 17.5 inches.

The backing plate 110 also contains at least one O-ring groove 172, fastener holes 174, at least one target alignment slot 176, and at least one pin slot 178. FIG. 1A depicts the front side 120 of the outer support surface 122 having three target alignment slots 176 encompassing a single O-ring groove 172 encompassing the inner target surface 124. The target alignment slots 176 are utilized to center the sputtering target 100 within the processing chamber, such as relative to the dark space shield 262 of the PVD chamber 200. FIG. 1C depicts that O-ring groove 172 as a two-sided groove formed within the outer support surface 122. An O-ring, a gasket, a sealant strip, or other type of sealing device used to form a sealed interface between two surfaces may be disposed within O-ring groove 172. O-ring groove 172 may have a depth within a range from about 0.10 inches to about 0.30 inches, such as about 0.16 inches, and a tapering width within a range from about 0.10 inches to about 0.50 inches, such as about 0.2 inches. The fastener holes 174 pass through the backing plate 110 and between the front side 120 and the back side 130 of the backing plate 110. A plurality of the fastener holes 174 encompasses the outside of the O-ring groove 172 and may be utilized to extend fasteners therethrough for attaching or coupling the sputtering target 100 to components or surfaces within the processing chamber, such as the PVD chamber 200. An O-ring disposed within the O-ring groove 172 forms a seal between the front side 120 of the backing plate 110 and the components of or surfaces within the processing chamber when the backing plate 110 is attached or coupled to the chamber by fasteners. The fasteners (not shown) may include bolts, screw, pins, clips, and the like. The plurality of fastener holes 174 may number within a range from about 10 holes to about 30 holes, such as about 16 holes. The fastener holes 174 may have a diameter within a range from about 0.10 inches to about 0.40 inches, such as about 0.22 inches. The backing plate 110 also contains a plurality of pin slots 178 disposed between the O-ring groove 172 and the outer edge of the backing plate 110. The plurality of pin slots 178 may number within a range from about 2 holes to about 8 holes, such as from about 3 holes to about 5 holes, for example, 4 holes are illustrated in FIG. 1A.

The target layer 150 contains a tapered edge 156 extending from the target surface 151 to the target side 158. The tapered edge 156 and the target side 158 annularly extend around and encompass the target surface 151. In one embodiment, the target surface 151 is substantially flat and is disposed in a processing chamber (e.g., PVD chamber 200) substantially parallel to a substrate support upper surface. The tapered edge 156 extends to a target side 158 on the backing plate 110. The target side 158 tapers radially inwardly as it approaches the interface between the target layer 150 and the backing plate 110. In some embodiments, the tapered edge 156 provides a smooth transition from a flat portion along the plane 152 of the target surface 151 to the target side 158 of the target layer 150 and promotes deposition uniformity by reducing abrupt changes in the target surface 151. Additionally, the tapered edge 156 has an arc or curvature at a predetermined corner radius to provide an optimum dark space gap, to prevent plasma arcing during a PVD process, and to provide highly uniform deposited films. In some embodiments, the predetermined corner radius of the tapered edge 156 may have a radius within a range from about 0.01 inches (0.25 mm) to about 0.15 inches (3.8 mm), such as from about 0.02 inches (0.5 mm) to about 0.08 inches (2.0 mm)—for example, about 0.04 inches (1.0 mm).

In alternative embodiments, the tapered edge 156 transitions from a flat portion along the plane 152 of the target surface 151 to a downwardly sloping portion or segment (which slopes from the plane 152 towards the plane 128—not shown) of the target surface 151 to the target side 158. The downwardly sloping portion or segment may have a length from about 0.20 inches to about 0.80 inches, such as about 0.50 inches and have an angle extending from and below the plane 152 within a range from about 5° to about 20°, such as about 10°.

In other embodiments, the target layer 150 may have a slightly longer diameter than the inner target surface 124 of the backing plate 110. Therefore, the target layer 150 may form an overhang such that the target side 158 extends peripherally further than the vertical portion of region 114—as depicted in FIG. 1D where the target layer 150 extends along the plane 128 further than the inner target surface 124. The protective coating layer 160 may be formed or deposited over the region 114 in order to be flush with the target side 158 (FIG. 1D) or may be thinner in order to provide the overhang that is not filled in with the material of the protective coating layer 160. Therefore, the target layer 150 may overhang the inner target surface 124 of the backing plate 110 around the perimeter of the inner target surface 124 by a length within a range from about 0.01 inches (0.25 mm) to about 0.05 inches (1.27 mm), such as about 0.03 inches (0.76 mm).

In one example, the sputtering target 100 is provided which includes a backing plate 110 containing a copper alloy and having a front side 120 opposite a back side 130, wherein the front side 120 contains an outer support surface 122 encompassing an inner target surface 124 and the back side 130 contains an outer back surface 132 encompassing an inner recessed surface 134, a target layer containing a nickel-platinum alloy disposed on the inner target surface 124 of the backing plate 110, and a protective coating layer 160 containing nickel disposed on at least a portion of the outer support surface 122, such as on the region 114, wherein the protective coating layer 160 has a thickness within a range from about 0.004 inches and 0.050 inches.

FIGS. 2 and 3A-3B depict PVD chamber 200 which contains the sputtering target 100 and a process kit 250 which may be utilized while processing a substrate 205. The process kit 250 includes at least a deposition ring 280 supported on a pedestal assembly 220, and may also include a shield 260 (e.g., a one-piece ground shield), a dark space shield 262 (e.g., an isolator ring), and an interleaving cover ring 270. The PVD chamber 200, also called a sputtering chamber, is capable of depositing metallic materials and/or ceramic materials, such as nickel, nickel alloys (e.g., nickel-platinum alloys), nickel silicide, nickel-platinum silicide, tungsten, tungsten silicide, tungsten nitride, tungsten carbide, cobalt, cobalt silicide, titanium, titanium oxide, titanium nitride, aluminum, aluminum oxide, copper, tantalum, tantalum nitride, tantalum carbide, lanthanum, lanthanum oxides, silicides thereof, alloys thereof, derivatives thereof, among others. One example of a processing chamber that may be adapted to benefit from embodiments described herein is the ALPS® Plus and SIP ENCORE® PVD processing chambers, available from Applied Materials, Inc., of Santa Clara, Calif. It is contemplated that other processing chambers including those from other manufacturers may be adapted to benefit from embodiments described herein.

The PVD chamber 200 includes a chamber body 201 having upper adapters 202 and sidewall adapters 204, a chamber bottom 206, and a lid assembly 208 which enclose an interior volume 210 or plasma zone. The chamber body 201 is typically fabricated by machining and welding metallic plates or by machining a single metallic body, such as aluminum, stainless steel, or alloys thereof. In one embodiment, the sidewall adapters 204 contain aluminum and the chamber bottom 206 contains stainless steel. The chamber bottom 206 generally contains a slit valve (not shown) to provide for entry and egress of the substrate 205 from the PVD chamber 200. The lid assembly 208 of the PVD chamber 200 in cooperation with the shield 260 that interleaves with the cover ring 270 confines a plasma formed in the interior volume 210 to the region above the substrate 205.

The pedestal assembly 220 is supported from the chamber bottom 206 of the PVD chamber 200. The pedestal assembly 220 supports the deposition ring 280 along with the substrate 205 during processing. The pedestal assembly 220 is coupled to the chamber bottom 206 of the PVD chamber 200 by a lift mechanism 222 which is configured to move the pedestal assembly 220 between a lower position (FIG. 2) and an upper position (FIG. 3A). Additionally, in the lower position, lift pins (not shown) are moved through the pedestal assembly 220 to space the substrate 205 from the pedestal assembly 220 to facilitate exchange of the substrate with a wafer transfer mechanism disposed exterior to the PVD chamber 200, such as a single blade robot (not shown). A bellow 224 is typically disposed between the pedestal assembly 220 and the chamber bottom 206 to isolate the interior volume 210 from the interior of the pedestal assembly 220 and the exterior of the PVD chamber 200.

The pedestal assembly 220 generally includes a substrate support 226 sealingly coupled to a base plate 228 which is coupled to a grounded plate 225. The substrate support 226 may be composed of aluminum, stainless steel, or ceramic materials. The substrate support 226 may be an electrostatic chuck, a ceramic body, a heater, or a combination thereof. In one embodiment, the substrate support 226 is an electrostatic chuck that includes a dielectric body having electrodes 238 embedded therein. The dielectric body is typically fabricated from a high thermal conductivity dielectric material such as pyrolytic boron nitride, aluminum nitride, silicon nitride, alumina, or an equivalent material. In one embodiment, the substrate support 226 is attached to the base plate 228 by a metal foil, such as an aluminum foil, which diffusion bonds the base plate 228 and the substrate support 226.

The base plate 228 may be composed of a material having thermal properties that are suitably matched to the overlying substrate support 226. For example, the base plate 228 can contain a composite material, such as aluminum silicon carbide. The composite material may have a thermal expansion coefficient that is matched to the material of the substrate support 226 to reduce thermal expansion mismatch. In one version, the composite material contains a ceramic material having pores that are infiltrated with a metal, which at least partially fills the pores to form a composite material. The ceramic material may contain, for example, at least one of silicon carbide, aluminum nitride, aluminum oxide, cordierite, or derivatives thereof. The ceramic material may contain a pore volume within a range from about 20 volume % to about 80 volume % of the total volume, the remainder volume being of the infiltrated metal. The infiltrated metal can contain aluminum with added silicon and may also contain copper. In another version, the composite may contain a different composition of a ceramic material and metal, such as metal having dispersed ceramic particles. Alternatively, the base plate 228 may be composed of a metal, such as stainless steel or aluminum. A cooling plate (not shown) is generally disposed within the base plate 228, but may also be disposed within the grounded plate 225, and may be utilized to thermally regulate the substrate support 226.

The grounded plate 225 is typically fabricated from a metallic material such as stainless steel or aluminum. The base plate 228 may be coupled to the ground plate by a plurality of connectors 237. The connectors 237 may be one of a bolt, screw, key, or any other type of connector. The base plate 228 may be removable from the grounded plate 225 for facilitating easier replacement and maintenance of the substrate support 226 and the base plate 228.

The substrate support 226 has a substrate receiving surface 227 that receives and supports the substrate 205 during processing, the substrate receiving surface 227 having a plane substantially parallel to a target surface 151 of the target layer 150. The substrate support 226 also has a peripheral edge 229 that terminates before an overhanging edge of the substrate 205. The peripheral edge 229 of the substrate support 226 has a diameter within a range from about 275 mm to about 300 mm. The substrate support 226 may have a height greater than about 0.25 inches, such as within a range from about 0.30 inches to about 0.75 inches. The height of the substrate support 226 beneficially spaces the substrate 205 vertically from the horizontal surfaces of the deposition ring 280 of the process kit 250, as further described below.

The lid assembly 208 generally contains a magnetron unit 234 disposed above the sputtering target 100. The sputtering target 100 contains the target layer 150 disposed with the backing plate 110. The backing plate 110 is supported within the PVD chamber 200 by the upper adapters 202, as shown in FIGS. 2 and 3A-3B. A ceramic ring seal 236 is disposed between the backing plate 110 and upper adapters 202 to prevent vacuum leakage therebetween. The target layer 150 is coupled to the backing plate 110 and exposed to the interior volume 210 of the PVD chamber 200. The target layer 150 provides material which is deposited on the substrate during a PVD process. The dark space shield 262 may be an isolator ring and is disposed between the sputtering target 100 and the chamber body 201 to electrically isolate the sputtering target 100 from the upper adapter 202 of the chamber body 201. A gap 264 is usually maintained between the backing plate 110 and the dark space shield 262, as well as the backing plate 110 and the ceramic ring seal 236. The protective coating layer 160 disposed on the backing plate 110 covers the underlying surface—such as the outer support surface 122—from plasma which enters into the gap 264.

The target layer 150 is biased with RF and/or DC power relative to ground, e.g., the chamber body 201, by a power source 240 coupled with the sputtering target 100. A gas, such as argon, is supplied to the interior volume 210 from a gas source 242 via conduits 244. The gas source 242 may contain a non-reactive gas such as argon, xenon, neon, or helium, which is capable of energetically impinging upon and sputtering material from the target layer 150. The gas source 242 may also include a reactive gas, such as one or more of an oxygen-containing gas, a nitrogen-containing gas, a methane-containing gas, that are capable of reacting with the sputtering material to form a layer on a substrate. Spent process gases and byproducts are exhausted from the PVD chamber 200 through exhaust ports 246 that receive spent process gas and direct the spent process gas to an exhaust conduit 248 having a throttle valve to control the pressure of the gas in the PVD chamber 200. The exhaust conduit 248 is connected to one or more exhaust pumps 249. Typically, the pressure of the sputtering gas in the PVD chamber 200 is set to sub-atmospheric levels, such as a vacuum environment, for example, gas pressures may be within a range from about 0.6 mTorr to about 400 mTorr. A plasma is formed from the gas between the substrate 205 and the target layer 150. Plasma ions are accelerated toward the target layer 150 and cause material to become dislodged from the target layer 150. The dislodged target material is subsequently deposited on the substrate surface.

The magnetron unit 234 is coupled to or with the backing plate 110 on the exterior of the PVD chamber 200. Specifically, the magnetron unit 234 is generally disposed on the back side 130 of the backing plate 110, such as on or just above at least the inner recessed surface 134. In order to maximize the magnet rotation diameter of the magnetron unit 234, a target recess diameter—which includes at least the diameter of the inner recessed surface 134 and any edge surface—is determined for achieving high uniformity and step coverage during a PVD process. One magnetron which may be utilized is described in U.S. Pat. No. 5,953,827, which is hereby incorporated by reference in its entirety.

Processes performed in the PVD chamber 200 are managed by a controller 290 which contains program code having instruction sets to operate components of the PVD chamber 200 to facilitate processing of substrates in the PVD chamber 200. For example, the controller 290 may have a program code that includes a substrate positioning instruction set to operate the pedestal assembly 220; a gas flow control instruction set to operate gas flow control valves to set a flow of sputtering gas to the PVD chamber 200; a gas pressure control instruction set to operate a throttle valve to maintain a pressure in the PVD chamber 200; a temperature control instruction set to control a temperature control system (not shown) in the pedestal assembly 220 or sidewall adapter 204 to set temperatures of the substrate or sidewall adapters 204, respectively; and a process monitoring instruction set to monitor the process within the PVD chamber 200.

The process kit 250 contains various components that can be easily removed from the PVD chamber 200, for example, to clean sputtering deposits off the component surfaces, replace, or repair eroded components, or to adapt the PVD chamber 200 for other processes. In one embodiment, the process kit 250 includes at least the deposition ring 280, but may also include the shield 260, the dark space shield 262, and the cover ring 270. In one embodiment, the cover ring 270 and deposition ring 280 are disposed about the peripheral edge 229 of the substrate support 226.

The shield 260 is supported by the chamber body 201 and the dark space shield 262 is supported, at least in part, by the shield 260. The dark space shield 262 encircles the target surface 151 of a sputtering target layer 150 that faces the substrate support 226. The shield 260 surrounds the peripheral edge 229 of the substrate support 226. The shield 260 also covers and shadows the sidewall adapters 204 of the PVD chamber 200 to reduce deposition of sputtering deposits originating from the target surface 151 of the sputtering target layer 150 onto the components and surfaces behind the shield 260. For example, the shield 260 can protect the surfaces of the substrate support 226, the overhanging edge of the substrate 205, sidewall adapters 204 and chamber bottom 206 of the PVD chamber 200.

While the foregoing is directed to embodiments of the invention, other and further embodiments of the invention may be devised without departing from the basic scope thereof, and the scope thereof is determined by the claims that follow.

The invention claimed is:

1. A sputtering target, comprising:
a backing plate having a front side opposed to a back side, wherein the front side contains an outer support surface having a plurality of fastener holes disposed therein, the outer support surface encompassing an inner target surface, the back side contains an outer back surface encompassing an inner recessed surface at a center of the backside, and the outer back surface has a target recess depth along a central axis of the backing plate and between parallel planes extending across the inner recessed surface and the outer back surface;
a target layer comprising at least one metal disposed on the inner target surface of the backing plate, wherein the inner recessed surface has a depth and a diameter, and the target layer extends outwardly from the central axis to a diameter that is less than the diameter of the inner recessed surface, the depth of said inner recessed surface being constant across the diameter of the inner recessed surface; and
a protective coating layer comprising nickel or tungsten disposed on at least a portion of the outer support surface, a portion of an outer surface of the protective coating layer being substantially coplanar with a plane of the outer support surface.

2. The sputtering target of claim 1, wherein the target layer comprises a material selected from the group consisting of nickel, platinum, a nickel-platinum alloy, tungsten, palladium, cobalt, alloys thereof, derivatives thereof, and combinations thereof.

3. The sputtering target of claim 2, wherein the material of the target layer comprises a nickel-platinum alloy.

4. The sputtering target of claim 3, wherein the nickel-platinum alloy comprises a platinum concentration by weight within a range from about 2% to about 20%.

5. The sputtering target of claim 4, wherein the platinum concentration by weight is within a range from about 5% to about 15%.

6. The sputtering target of claim 3, wherein the nickel-platinum alloy comprises a nickel concentration by weight within a range from about 80% to about 98%.

7. The sputtering target of claim 6, wherein the nickel concentration by weight is within a range from about 85% to about 95%.

8. The sputtering target of claim 1, wherein the target layer has a thickness within a range from about 0.050 inches to about 0.400 inches.

9. The sputtering target of claim 8, wherein the target layer has a diameter within a range from about 16 inches to about 19 inches.

10. The sputtering target of claim 1, wherein the backing plate comprises a copper-zinc alloy.

11. The sputtering target of claim 1, wherein the protective coating layer has a thickness within a range from about 0.004 inches and 0.050 inches.

12. The sputtering target of claim 11, wherein the protective coating layer comprises plasma-sprayed, metallic nickel and the target layer comprises nickel or a nickel alloy.

13. The sputtering target of claim 11, wherein the protective coating layer comprises plasma-sprayed, metallic tungsten and the target layer comprises tungsten or a tungsten alloy.

14. The sputtering target of claim 1, wherein the predetermined distance along the central axis and between the parallel planes is within a range from about 0.05 inches to about 0.50 inches.

15. A sputtering target, comprising:
a backing plate comprising a copper alloy and having a front side opposed to a back side, wherein the front side contains an outer support surface having a plurality of fastener holes disposed therein, the outer support surface encompassing an inner target surface extending from a plane of the outer support surface and the back side contains an outer back surface encompassing an inner recessed surface extending from a central axis thereof to the outer back surface between parallel planes extending across the inner recessed surface and the outer back surface;
a target layer comprising a nickel-platinum alloy disposed on the inner target surface of the backing plate, wherein the inner recessed surface has a depth and a diameter, and the target layer extends outwardly from the central axis to a diameter that is less than the diameter of the inner recessed surface, the depth of said inner recessed surface being constant across the diameter of the inner recessed surface; and
a protective coating layer comprising nickel disposed on at least a portion of the outer support surface adjacent to the inner target surface, a portion of an outer surface of the protective coating layer being substantially coplanar with the plane of the outer support surface, wherein the protective coating layer has a thickness within a range from about 0.004 inches and 0.040 inches and an upper surface of the protective coating layer comprises a mean surface roughness within a range from about 100 microinches to about 500 microinches.

16. The sputtering target of claim 15, wherein the nickel-platinum alloy comprises a nickel concentration by weight within a range from about 80% to about 98% and a platinum concentration by weight within a range from about 2% to about 20%.

17. The sputtering target of claim 15, wherein the copper alloy comprises a copper-zinc alloy, and the copper-zinc alloy further comprises a copper concentration by weight within a range from about 58% to about 62% and a zinc concentration by weight within a range from about 38% to about 42%.

18. A sputtering target, comprising:
a backing plate comprising a copper alloy and having a front side opposed to a back side, wherein the front side contains an outer support surface encompassing an inner target surface and the back side contains an outer back surface encompassing an inner recessed surface extending from a central axis thereof to the outer back surface, and a sidewall between the inner recessed surface and the outer back surface tapers inwardly towards the central axis;
a target layer comprising metallic tungsten disposed on the inner target surface of the backing plate, wherein the inner recessed surface has a depth and a diameter, and the target layer has a thickness within a range from about 0.150 inches and 0.350 inches, wherein the target layer extends outwardly from the central axis to a diameter that is less than the diameter of the inner recessed surface, and the depth of said inner recessed surface being constant across the diameter of the inner recessed surface; and
a protective coating layer comprising tungsten disposed on at least a portion of the outer support surface, wherein the protective coating layer has a thickness within a range from about 0.004 inches and 0.040 inches and an upper surface of the protective coating layer comprises a mean surface roughness within a range from about 100 microinches to about 500 microinches.

19. A sputtering target, comprising:
a backing plate having a front side opposed to a back side, wherein the front side contains an outer support surface encompassing an inner target surface extending from a plane of the outer support surface, the back side contains an outer back surface encompassing an inner recessed surface having a predetermined depth along and through a central axis of the backing plate, and a sidewall between the inner recessed surface and the outer back surface tapers inwardly towards the central axis;
a target layer comprising at least one metal disposed on the inner target surface of the backing plate, wherein the inner recessed surface has a depth and a diameter, and the target layer extends outwardly from the central axis to a diameter that is less than the diameter of the inner recessed surface, the depth of said inner recessed surface being constant across the diameter of the inner recessed surface; and
a protective coating layer comprising nickel or tungsten disposed on at least a portion of the outer support surface.

20. The sputtering target of claim 19, wherein the target layer comprises a material selected from the group consisting of nickel, platinum, a nickel-platinum alloy, tungsten, palladium, cobalt, alloys thereof, derivatives thereof, and combinations thereof.

* * * * *

UNITED STATES PATENT AND TRADEMARK OFFICE
CERTIFICATE OF CORRECTION

PATENT NO. : 8,968,537 B2
APPLICATION NO. : 13/024198
DATED : March 3, 2015
INVENTOR(S) : Rasheed et al.

It is certified that error appears in the above-identified patent and that said Letters Patent is hereby corrected as shown below:

In the Specification

Column 2, Line 51, please delete "(pin)" and insert --($\mu$in)-- therefor.

Signed and Sealed this
Twenty-fifth Day of August, 2015

Michelle K. Lee
*Director of the United States Patent and Trademark Office*